(12) United States Patent
Kurimoto

(10) Patent No.: US 11,574,509 B2
(45) Date of Patent: Feb. 7, 2023

(54) VEHICLE DIAGNOSTIC SYSTEM, VEHICLE, AND METHOD OF DISPLAY OF VEHICLE DIAGNOSTIC RESULT

(71) Applicant: TOYOTA JIDOSHA KABUSHIKI KAISHA, Toyota (JP)

(72) Inventor: Yasuhide Kurimoto, Kasugai (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/326,486

(22) Filed: May 21, 2021

(65) Prior Publication Data

US 2021/0398365 A1 Dec. 23, 2021

(30) Foreign Application Priority Data

Jun. 18, 2020 (JP) .............................. JP2020-105153

(51) Int. Cl.
*G07C 5/08* (2006.01)
*B60L 58/16* (2019.01)
*B60L 58/13* (2019.01)

(52) U.S. Cl.
CPC ............ *G07C 5/0825* (2013.01); *B60L 58/13* (2019.02); *B60L 58/16* (2019.02); *G07C 5/0808* (2013.01)

(58) Field of Classification Search
None
See application file for complete search history.

(56) References Cited

U.S. PATENT DOCUMENTS

| 2014/0107956 | A1* | 4/2014 | Miyaki | ................. G01R 31/392 702/63 |
| 2017/0282745 | A1* | 10/2017 | Kawamura | ........... H01M 16/00 |
| 2017/0361729 | A1* | 12/2017 | Bryngelsson | ........... B60L 53/00 |
| 2018/0050601 | A1* | 2/2018 | Katanoda | ................ B60L 58/13 |
| 2021/0178927 | A1* | 6/2021 | Yamamoto | ........... H02J 7/00711 |

FOREIGN PATENT DOCUMENTS

| JP | 2009-097954 A | 5/2009 |
| JP | 2011-057116 A | 3/2011 |
| JP | 2013-154717 A | 8/2013 |

\* cited by examiner

*Primary Examiner* — Jared Fureman
*Assistant Examiner* — Joel Barnett
(74) *Attorney, Agent, or Firm* — Sughrue Mion, PLLC

(57) ABSTRACT

A vehicle diagnostic system diagnoses a vehicle having a battery mounted thereon. The vehicle diagnostic system includes an instrument panel for showing a capacity retention of the battery, and an ECU that calculates the capacity retention to be displayed on the instrument panel. The ECU measures the full charge capacity of the battery each time external charging is completed, and, based on a result of the measurement, updates a capacity deterioration curve indicative of changes in over time of the capacity retention. When a display request for showing the capacity retention on the instrument panel is generated, the ECU calculates the capacity retention when the display request is generated by referring to the updated capacity deterioration curve.

9 Claims, 6 Drawing Sheets

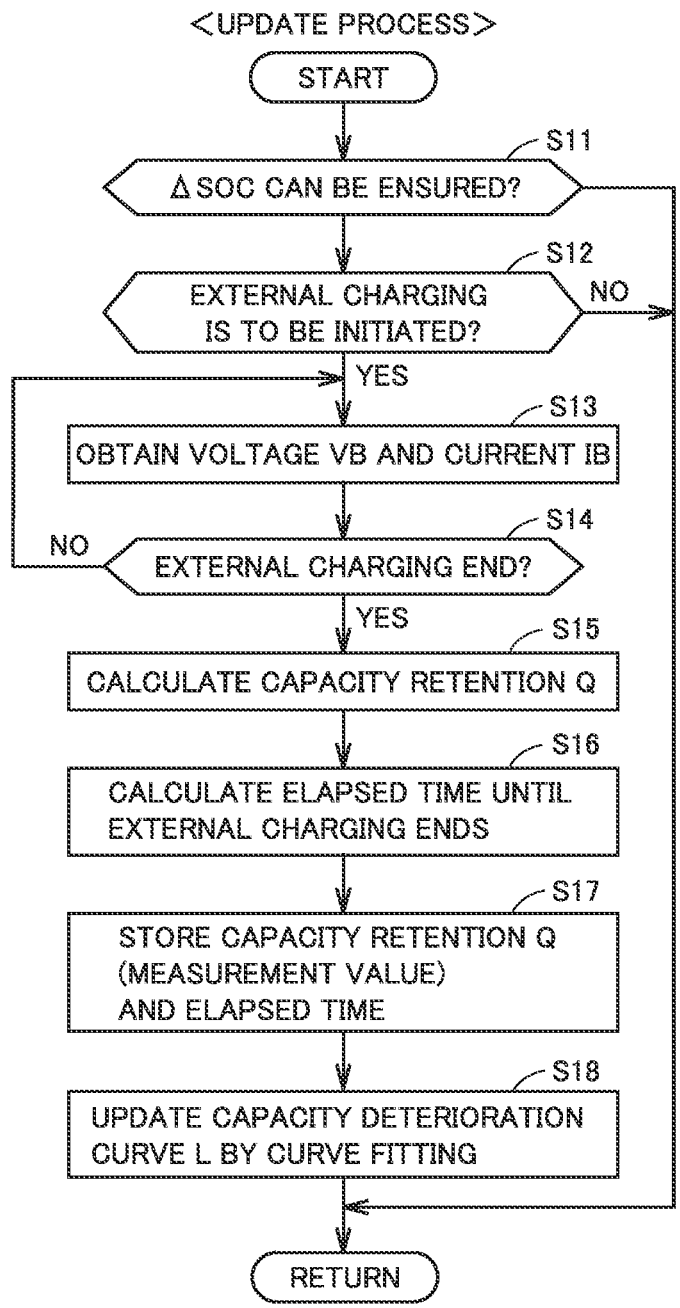

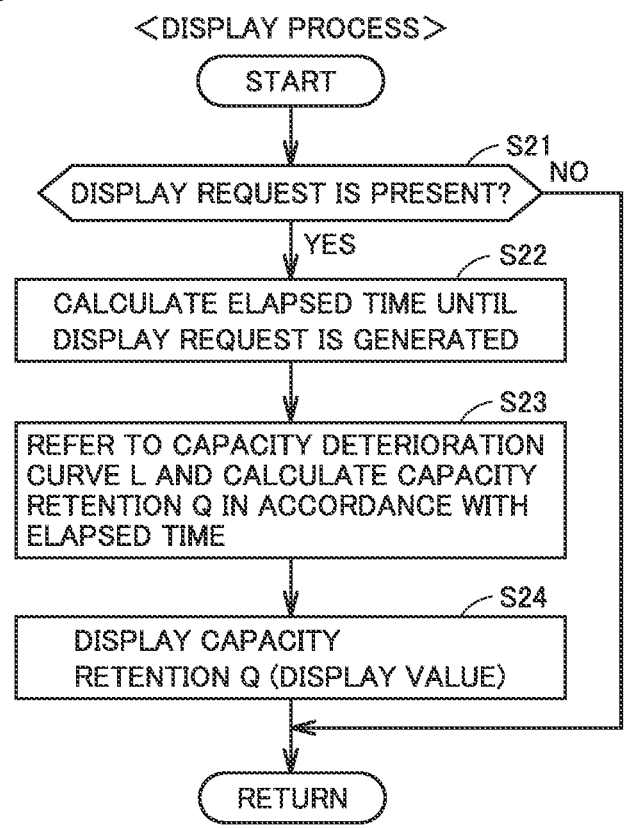

VEHICLE DIAGNOSTIC SYSTEM, VEHICLE, AND METHOD OF DISPLAY OF VEHICLE DIAGNOSTIC RESULT

This nonprovisional application is based on Japanese Patent Application No. 2020-105153 filed on Jun. 18, 2020 with the Japan Patent Office, the entire content of which is hereby incorporated by reference.

BACKGROUND

Field

The present disclosure relates to a vehicle diagnostic system, a vehicle, and a method of display of vehicle diagnostic results, and, more particularly, to a technology for displaying the degree of reduction of the full charge capacity of a power storage device mounted on a vehicle.

Description of the Background Art

In recent years, vehicles having mounted thereon a battery are popular. Among these vehicles, some are capable of traveling using only a motor (what is called EV traveling). The performance and condition of the battery can directly affect various critical functions of the vehicle, such as a driving force of the vehicle, and a distance for which the EV traveling is allowed. Therefore, various pieces of information on the battery can be said to be interesting information to users.

A display for showing information on a battery is proposed. For example, Japanese Patent Laying-Open No. 2011-57116 discloses a plug-in hybrid vehicle which includes a display for showing the state of charge (SOC) of a battery.

SUMMARY

In general, the battery deteriorates over time, depending on its manner of use. As the battery deteriorates and the full charge capacity of the battery decreases, the EV travel range can be shorter. For this reason, it is contemplated that an "indicator of deterioration" indicating the degree of reduction of the full charge capacity of the battery is shown on a display and a user can confirm the indicator of deterioration. The indicator of deterioration is, for example, the capacity retention of a battery.

The inventor has noted that if the user is allowed to check the indicator of deterioration over a long period of time (e.g., several years), the following problem can occur. The indicator of deterioration does not always change smoothly over time, and, more or less, can change atypically. More specifically, the accuracy of measurement of the indicator of deterioration decreases during a certain period of time over other periods, and an error can increase between the indicator of deterioration measured and the actual indicator of deterioration. Thus, the indicator of deterioration can change greatly at the transition from a period in which the measurement of the indicator of deterioration has a relatively small error and a period in which the measurement of the indicator of deterioration has a large error. As a result, the user checking the indicator of deterioration may feel uncomfortable with the indicator.

The present disclosure is made in view of the above problem, and an object of the present disclosure is to make the user less uncomfortable when checking the degree of reduction of the full charge capacity of a power storage device.

(1) A vehicle diagnostic system according to a certain aspect of the present disclosure is a vehicle diagnostic system that diagnoses a power storage device mounted on a vehicle, the vehicle diagnostic system including: a display that shows an indicator of deterioration indicating a degree of reduction of a full charge capacity of the power storage device; and a processor that calculates the indicator to be displayed on the display. The processor calculates a capacity deterioration curve indicative of changes in over time of the indicator, based on the full charge capacity of the power storage device that is measured each time a predetermined condition is met, and calculates the indicator by referring to the calculated capacity deterioration curve.

(2) The processor measures the full charge capacity of the power storage device each time the predetermined condition is met, updates the capacity deterioration curve, based on a result of measurement of the full charge capacity of the power storage device. When a display request for showing the indicator on the display is generated, the processor calculates the indicator upon at a time when the display request is generated, by referring to the updated capacity deterioration curve.

(3) The capacity deterioration curve is indicated by a predetermined relation. The relation includes the indicator and an elapsed time since a reference time as variables, and includes a plurality of coefficients defining a relationship between the indicator and the elapsed time. The processor determines the plurality of coefficients by a regression analysis of the indicator and the elapsed time, the indicator being determined from the result of measurement of the full charge capacity of the power storage device at a time when the predetermined condition is met, and updates the capacity deterioration curve using the relation that includes the determined plurality of coefficients.

With the configurations (1) through (3) above, rather than simply showing the measured indicator of deterioration on the display, the indicator that is calculated using the capacity deterioration curve is shown on the display. The use of the capacity deterioration curve allows the transition of the indicator to be determined based on the measurement values in the past (which may include the latest measurement value), allowing the estimation of the indicator at the present time (at which the display request is generated). Furthermore, this allows the indicator to change smoothly, preventing sudden change in the indicator. Thus, according to the configurations (1) through (3) above, the user can feel less uncomfortable with the indicator.

(4) The vehicle is capable of performing external charging in which an electric power supplied external to the vehicle is charged to the power storage device. The time when the predetermined condition is met includes after completion of the external charging.

In general, while external charging is being performed, the amount of electric power stored in the power storage device greatly change, as compared to during normal running. The greater the change in amount of electric power, the higher the accuracy of measurement of the full charge capacity (see FIG. 4). Accordingly, with the configuration (4) above, a highly accurate capacity deterioration curve can be determined, and an accurate indicator of deterioration can be thereby shown on the display.

(5) The indicator includes a capacity retention of the power storage device.

(6) The indicator includes the full charge capacity of the power storage device.

(7) The indicator includes a distance that the vehicle can travel with an electric power stored in the power storage device.

(8) The display shows the capacity deterioration curve, in addition to the indicator.

With the configuration (8) above, by showing the capacity deterioration curve, a user can intuitively grasp the transition of the indicator.

(9) A vehicle according to other aspect of the present disclosure includes the vehicle diagnostic system described in any of (1) through (8) above, and the power storage device.

With the configuration (9) above, the user can feel less uncomfortable with the indicator, as with the configuration (1) above.

(10) A method of display of a vehicle diagnostic result according to still other aspect of the present disclosure displays a result of diagnosis of a vehicle on which a power storage device is mounted. The method includes a first step, a second step, and a third step. The first step is measuring a full charge capacity of the power storage device each time a predetermined condition is met, and, based on a result of measuring of the full charge capacity, updating a capacity deterioration curve indicative of changes in over time of an indicator of deterioration of the power storage device. The second step is calculating, when a display request for showing the indicator is generated, the indicator at a time when the display request is generated, by referring to the updated capacity deterioration curve. The third step is showing the indicator calculated in the calculating step.

With the method (10) above, the user can feel less uncomfortable with the indicator, as with the configuration (1) above.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 7 is a flowchart illustrating the capacity deterioration curve update process.

FIG. 8 is a flowchart illustrating the capacity retention display process.

DESCRIPTION OF THE PREFERRED EMBODIMENTS

Hereinafter, the present embodiment will be described, with reference to the accompanying drawings. Note that the same reference sign is used to refer to the same or like parts, and the description thereof will not be repeated.

In the following embodiment, a description will be given with reference to a vehicle to be diagnosed being capable of performing "external charging" in which an externally supplied electric power is charged to a battery. However, it is not essential that the vehicle be capable of external charging. The vehicle may be one that does not support external charging (such as a typical hybrid vehicle).

In the present embodiment, a capacity retention (unit: %) of a battery is used as an "indicator of deterioration" representing the degree of reduction of the full charge capacity of the battery. Capacity retention Q of a battery refers to a percentage of a full charge capacity C of the battery at the present time to a full charge capacity C0 of the battery in the initial state (e.g., the battery as manufactured) (Q=C/C0). However, as the "indicator of deterioration" of the battery, an EV travel range (unit: km) of the vehicle may be used instead of or in addition to the capacity retention of the battery. As the "indicator of deterioration" of the battery, the full charge capacity (unit: Ah or Wh) as is of the battery may also be used. Two or all of the capacity retention, the EV travel range, and the full charge capacity may further be used.

Embodiment

<System Configuration>

Figure 1:
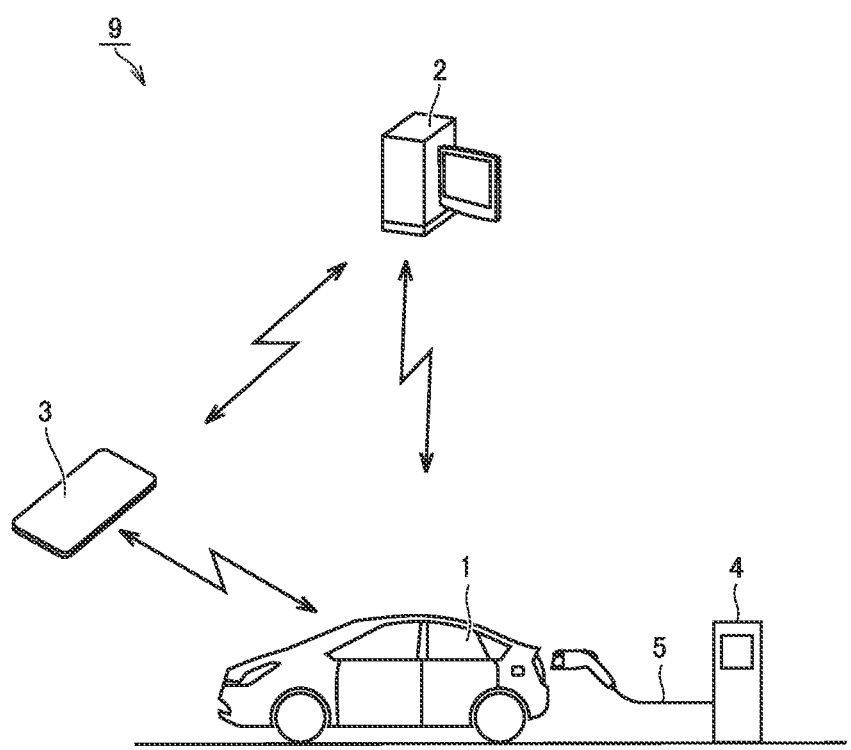
FIG. 1 is an overall configuration diagram of a vehicle diagnostic system according to the present embodiment.

FIG. 1 is an overall configuration diagram of a vehicle diagnostic system according to the present embodiment. Referring to FIG. 1, a vehicle diagnostic system 9 includes a vehicle 1, a server 2, and a mobile terminal 3. The vehicle 1 and the server 2 are capable of two-way communications with each other. The server 2 and the mobile terminal 3 are also capable of two-way communications with each other. Furthermore, the vehicle 1 and the mobile terminal 3 are also capable of two-way communications with each other.

Figure 2:
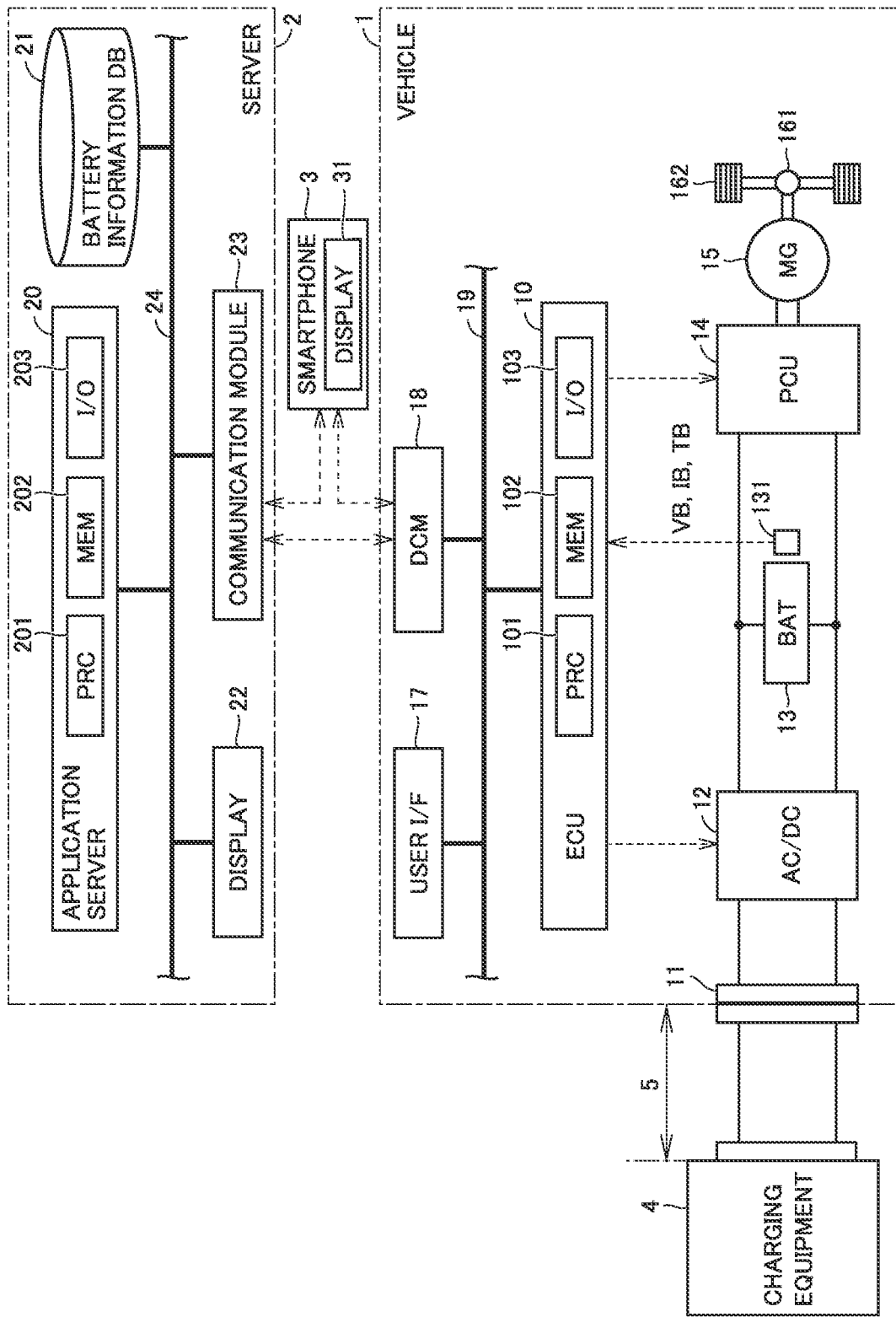
FIG. 2 is a diagram showing configurations of a vehicle, a server, and a mobile terminal in more detail.

The vehicle 1 is capable of "external charging" (also called plug-in charging) in which an electric power is supplied from an external charging equipment 4 via a charging cable 5, and charged to a vehicle battery 13 (see FIG. 2). In the present embodiment, the vehicle 1 is an electric vehicle. However, the vehicle 1 may be a plug-in hybrid vehicle or a fuel cell vehicle. Although not shown, the vehicle 1 may be capable of non-contact charging in which an electric power is transmitted in a contactless manner from a power transmission apparatus embedded in the ground to a power receiver apparatus (such as a receiving coil) mounted in the vehicle 1.

The vehicle 1 is capable of diagnosing the vehicle battery 13. The server 2 may also be capable of diagnosing the vehicle battery 13. In this case, the vehicle 1 transmits to the server 2 various pieces of data that are required for the server 2 to diagnose the vehicle battery 13. Based on the data collected from the vehicle 1, the server 2 diagnoses the battery 13, and transmits a result of the diagnosis to the vehicle 1 and/or the mobile terminal 3. The vehicle 1 receives from the server 2 the result of the diagnosis of the battery 13 made by the server 2.

The mobile terminal 3 is, for example, smartphone or a smart watch owned by a user of the vehicle 1. The mobile terminal 3 receives the result of the diagnosis of the battery 13 made by the vehicle 1 or the server 2. Note that a fixed terminal installed in the user's home, such as a personal computer (PC), may be used, instead of the mobile terminal 3.

The charging equipment 4 includes a power conversion device for supplying the vehicle 1 with an electric power that is used for external charging. The charging equipment 4 is installed in a home of the vehicle 1's user, for example. The place of installation of the charging equipment 4 is not particularly limited, and may be installed in an outside-the-home location (such as a workplace or an accommodation). Note that the charging equipment 4 is, typically, alternating-current (AC) charging equipment (so called a normal charger), it should be noted that charging station 4 may be direct-current (DC) charging equipment (so called a fast charger).

FIG. 2 is a diagram showing the configurations of the vehicle 1, the server 2, and the mobile terminal 3 in more detail. Referring to FIG. 2, the vehicle 1 includes an inlet 11, an AC-to-DC converter 12, the battery 13, a power control unit (PCU) 14, a motor generator 15, a mechanical power transmission gear 161, driving wheels 162, a user interface 17, a data communication module (DCM) 18, a vehicle network 19, and an electronic control unit (ECU) 10.

The inlet 11 is connectable to a charging plug (not shown) of the charging cable 5. The AC-to-DC converter 12 converts an AC power into a DC power, and outputs the DC power to the battery 13. The AC power is supplied to the vehicle 1 from the charging equipment 4 via the charging cable 5 and the inlet 11.

Note that the configuration for external charging with an electric power supplied from the charging equipment 4 is not limited to the configuration shown in FIG. 2. For example, if the charging equipment 4 is a charger (a fast charger) that supplies DC power, the AC-to-DC converter 12 may be omitted. Alternatively, a DC-to-DC converter (not shown) may be provided, instead of the AC-to-DC converter 12.

The battery 13 supplies an electric power for generating a driving force for the vehicle 1. The battery 13 also stores an electric power generated by the motor generator 15. The battery 13 is an assembled battery formed of multiple cells. Each cell is a secondary battery, such as a lithium-ion battery or a nickel-hydrogen battery. Note that the battery 13 corresponds to a "power storage device" according to the present disclosure. A large capacitor, such as an electric double layer capacitor, may be employed as the "power storage device."

A monitoring unit 131 is provided for the battery 13. The monitoring unit 131 monitors the condition of the battery 13. Specifically, the monitoring unit 131 includes a voltage sensor, a current sensor, and a temperature sensor (none of which are shown). The voltage sensor detects a voltage VB of the battery 13. The current sensor detects a current IB that is input/output to/from the battery 13. The temperature sensor detects a temperature TB of the battery 13. Each sensor outputs a result of the detection to the ECU 10. Based on the results of detection by the respective sensors, the ECU 10 can calculate the SOC of the battery 13, and calculate the capacity retention Q of the battery 13, for example.

The PCU 14 converts the DC power stored in the battery 13 into an AC power, and supplies the AC power to the motor generator 15, in accordance with commands from the ECU 10. The PCU 14 also converts the AC power generated by the motor generator 15 into a DC power, and supplies the DC power to the battery 13. The PCU 14 includes a converter and an inverter (none of which are shown).

The motor generator 15 is an AC rotating electric machine, for example, a permanent-magnet, synchronous motor which includes a rotor having a permanent magnet embedded therein. The output torque of the motor generator 15 is conveyed to the driving wheels 162 through the mechanical power transmission gear 161, causing the vehicle 1 to travel. Upon breaking operation by the vehicle 1, the motor generator 15 can generate an electric power through the rotational force of the driving wheels 162. The electric power generated by the motor generator 15 is converted by the PCU 14 into a power charged to the battery 13.

The user interface 17 is capable of providing the user with various pieces of information on the vehicle 1, and receiving various user operations, for example. An example configuration of the user interface 17 will be described with respect to FIG. 3.

The DCM 18 wirelessly communicates with the server 2. The DCM 18 wirelessly communicates also with the mobile terminal 3 of the user.

The vehicle network 19 is a wired network, such as a controller area network (CAN). The vehicle network 19 connects the user interface 17, the DCM 18, and the ECU 10 to one another, and allows them to share or transmit/receive data (including commands, messages, etc.) therebetween.

The ECU 10 includes a processor 101, such as a central processing unit (CPU), a memory 102, such as a read only memory (ROM) and a random access memory (RAM), and input/output ports 103. Based on input of a signal from each sensor, and maps and programs stored in the memory 102, the ECU 10 controls each device so that vehicle 1 is brought into a desired state. In the present embodiment, examples of the main processing performed by the ECU 10 include a process of calculating the capacity retention Q of the battery 13 and providing a result of the calculation to the user. This process will be described below.

The server 2 performs various computation processes on data that are obtained from multiple vehicles, including the vehicle 1. In the present embodiment, the server 2 calculates the capacity retention Q of the battery 13 mounted on the vehicle 1, and provides a result of the calculation to the vehicle 1. The server 2 may be, for example, one that is managed by the manufacturer of the vehicle 1, or one that is managed by an information providing service operator for the user. The server 2 includes a battery information database (a database server) 21, a display 22, a communication module 23, an intra-server network 24, and an application server 20.

The battery information database 21 stores "battery information," which is information used to diagnose the battery 13 mounted on the vehicle 1 (and batteries that are mounted on other vehicles in a similar manner).

The display 22 shows a result of diagnosis of the battery 13 performed by the application server 20 (a result of calculation of the capacity retention Q). Note that the display 22 and the application server 20 may be installed in different locations. For example, the display 22 may be installed in a car dealership which the user of the vehicle 1 can visit.

The communication module 23 wirelessly communicates with the DCM 18 mounted on the vehicle 1. The communication module 23 wirelessly communicates also with the mobile terminal 3 of the user of the vehicle 1.

The intra-server network 24 connects the battery information database 21, the communication module 23, and the application server 20 to one another to allow them to share or transmit/receive data (including commands, messages) therebetween.

As with the ECU 10, the application server 20 includes a processor 201, a memory 202, and input/output ports 203. The application server 20 is capable of performing a diagnosis of the battery and providing the user with a result of diagnosis of the battery 13 (a result of calculation of the capacity retention Q of battery 13). Note that either one of the ECU 10 and the application server 20 or both correspond to a "processor" according to the present disclosure.

The mobile terminal 3 includes a display 31. The display 31 shows a result of diagnosis of the battery 13 made by the ECU 10 or the application server 20.

Figure 3:
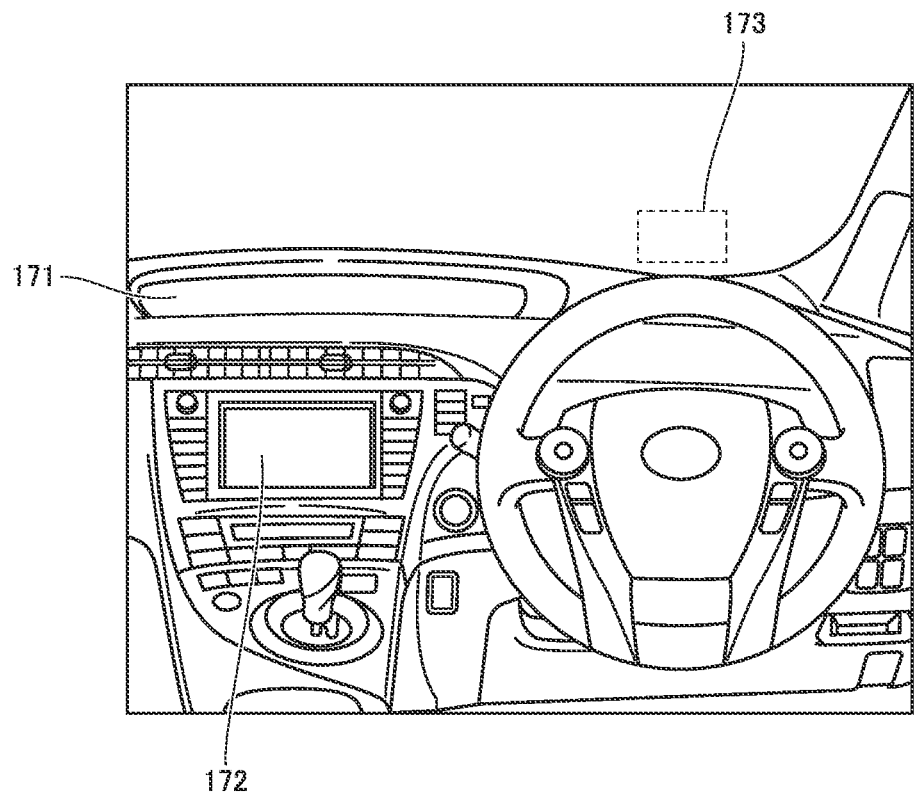
FIG. 3 is a diagram showing an example configuration of a user interface provided in the vehicle.

FIG. 3 is a diagram showing an example configuration of the user interface 17 provided in the vehicle 1. Referring to FIGS. 2 and 3, the user interface 17 includes an instrument panel (an instrument panel) 171, a head-up display (HUD) 172, and a navigation screen 173.

The instrument panel 171 is a dashboard in which meters are installed, and displays various states of vehicle 1, according to control by the ECU 10. More specifically, the instrument panel 171 displays the speedometer, the tripmeter, the SOC of the battery 13, idiot lights, etc., and also displays the capacity retention Q of the battery 13. Note that a multi-information display (MID) may be used, instead of the instrument panel 171.

The HUD 172 projects various pieces of information in front of the driver's field of view as a virtual image. Specifically, the HUD 172 displays the vehicle speed of the vehicle 1, the direction of travel to the destination, traffic signs, etc. The capacity retention Q of the battery 13 may be displayed on the HUD 172.

The navigation screen 173 is a display of a navigation system (not shown). The navigation system includes a global positioning system (GPS) receiver for locating the vehicle 1 based on a radio wave from an artificial satellite. The navigation system displays, on the navigation screen 173, the current location of vehicle 1 and a recommended route to the destination of vehicle 1, based on GPS data of the vehicle 1 and road map data. The navigation screen 173 may be a touch screen monitor (not shown). The capacity retention Q of the battery 13 can be displayed also on the navigation screen 173.

As the battery 13 deteriorates and the capacity retention Q of the battery 13 decreases, the EV travel range of the vehicle 1 is shortened. Thus, the capacity retention Q of the battery 13 is shown on the "display" so that the user can check the capacity retention Q as appropriate. In this example, at least one of the instrument panel 171, the HUD 172, and the navigation screen 173 of the vehicle 1 corresponds to a "display" according to the present disclosure. The "display" may be the display 22 of the server 2 or the display 31 of the mobile terminal 3. For ease of description, a description will be given below, with reference to the capacity retention Q of the battery 13 being displayed on the instrument panel 171.

<Error in Measurement of Capacity>

The inventor has noted that the accuracy of measurement of the capacity retention Q of the battery 13 can be affected by the following two factors. The first factor is an amount of electric power charged to the battery 13.

Figure 4:
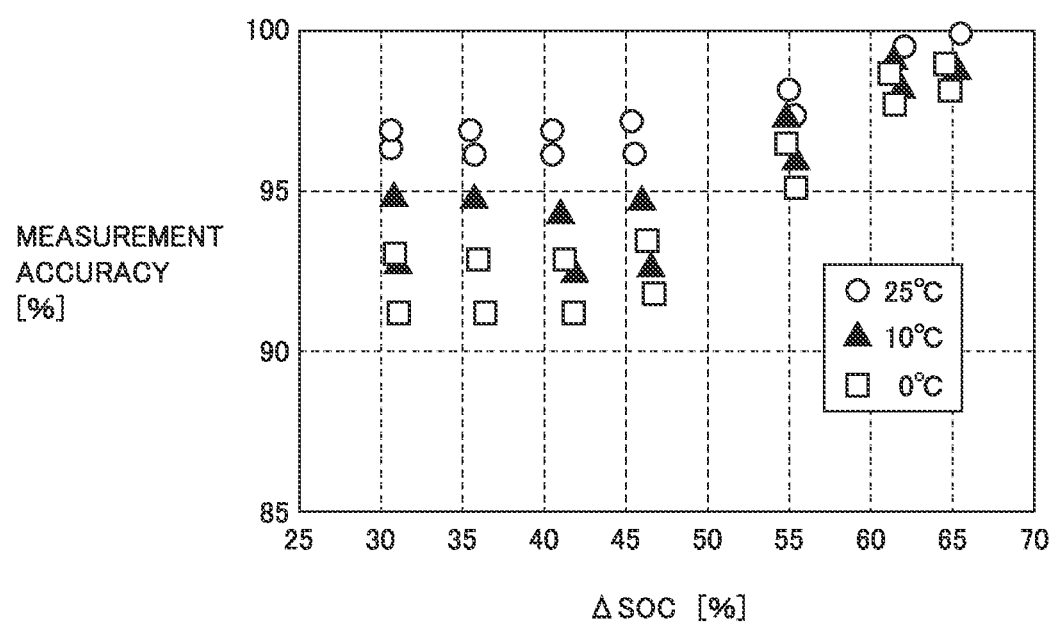
FIG. 4 is a diagram showing effects of the amount of electric power charged to a battery on the accuracy of measurement of the capacity retention of the battery.

FIG. 4 is a diagram showing effects of the amount of electric power charged to the battery on the accuracy of measurement of the capacity retention Q of the battery. FIG. 4 shows results of calculations of the full charge capacity of the battery after constant power charging (CP charging) is performed on the battery under three types of temperature conditions (25 degrees Celsius, 10 degree Celsius, and zero degree Celsius in this example).

Amounts of electric power charged to the battery in terms of SOC (ΔSOC) are shown on the horizontal axis. The ΔSOC in this measurement example ranges from about 30% to about 65%. The accuracy of measurement of the full charge capacity of the battery is shown on the vertical axis. The accuracy of measurement indicates a ratio of the full charge capacity measured by a general vehicle charging method to a full charge capacity measured by a charging method serving as a benchmark. Specifically, the accuracy of measurement uses, as a reference (measurement accuracy=100%), a result of measurement by a charging method in accordance with a constant current-constant voltage charging (CCCV) scheme defined in IEC62660, which is the International Standard specifying an electric-powered vehicle cell test procedure.

As shown in FIG. 4, the less the amount of electric power charged to the battery (ΔSOC), the lower the accuracy of measurement of the capacity retention Q (the full charge capacity) of the battery is. From a different point of view, in order to improve the accuracy of measurement of the capacity retention Q of the battery 13, ΔSOC may be increased as much as possible. In short in the present embodiment, one should note that it is desirable that the capacity retention Q of the battery 13 be measured on the occasion of external charging, in particular, when a condition for external charging that ensures a large ΔSOC is met (e.g., when ΔSOC≥55%).

Moreover, one can see, from FIG. 4, that the accuracy of measurement of the capacity retention Q of the battery can be kept at or above a certain value (95% or greater), irrespective of the magnitude of ΔSOC, if the temperature of the battery is higher than a predetermined temperature (25 degrees Celsius or higher in the example of FIG. 4). On the contrary, if one wishes to ensure the accuracy of measurement to be, for example, 95% or higher, it is desirable that the capacity retention Q of the battery 13 not be measurement on the occasion of external charging under conditions where the temperature of the battery 13 is less than 25 degrees Celsius and ΔSOC is less than 55%.

As such, the accuracy of measurement of the full charge capacity of the battery 13 can be affected also by the timing (season) of measurement of the capacity retention Q of the battery 13 (the second factor), in addition to ΔSOC accompanying the external charging.

Figure 5:
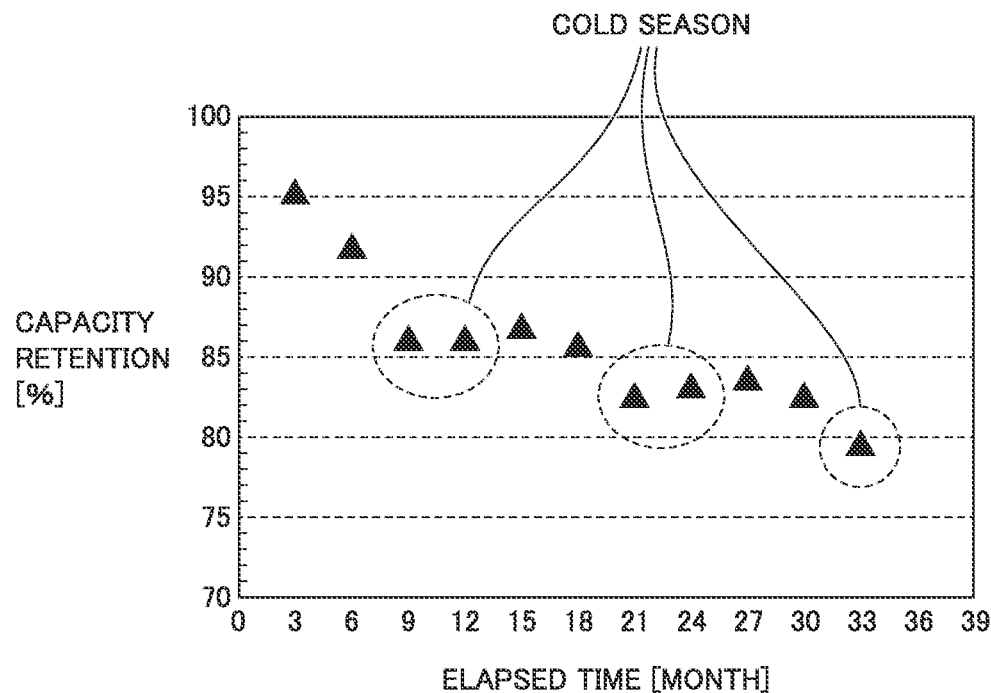
FIG. 5 is a diagram illustrating one example of effects of the timing of measurement of the capacity retention of the battery on a result of measurement of the capacity retention.
Figure 6:
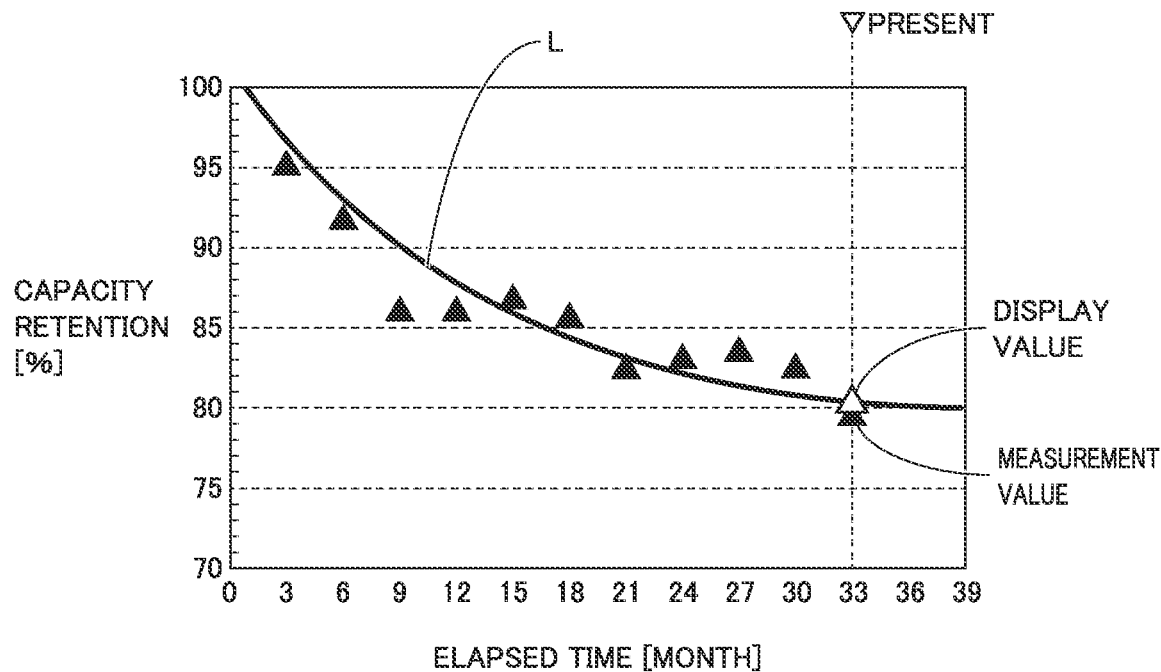
FIG. 6 is a diagram for illustrating a capacity deterioration curve update process and a capacity retention display process according to the present embodiment.

FIG. 5 is a diagram illustrating one example of effects of the timing of measurement of the capacity retention Q of the battery on a result of measurement of the capacity retention Q. In FIG. 5 and FIG. 6 described below, a time elapsed since the time of manufacturing of the battery is indicated on the horizontal axis. The capacity retention Q of the battery is indicated on the vertical axis.

FIG. 5 shows results of measurements (actual measurements) of the capacity retention Q of the battery that are carried out every three month since the time of manufacturing of the battery 13. In the figure, results of measurements of the capacity retention Q during a cold season (which may be the winter season, or, more broadly, a period from the late fall to the early spring) are circled. It is understood, from FIG. 5, that the capacity retention Q measured in a cold season tends to be lower than the capacity retention Q measured in the other seasons (a warmer season, such as the summer).

According to the study by the inventor, the capacity retention Q measured in a warm season is close to the actual capacity retention (the true value). In contrast, the capacity retention Q measured in a cold season tends to have a large error and likely to have a large divergence from the true value. The reason for this can be explained as follows. Reduction in temperature of the battery in a cold season increases the internal resistance of the battery. The higher the internal resistance of the battery is, the greater the amount of heat loss (Joule heat) of the battery caused accompanying the external charging. Therefore, if the amount of electric power charged to the battery is measured by the current integration method, the amount of charged electric power measured can have an increased error relative to the amount of electric power that is actually charged to the battery.

If the capacity retention Q of the battery 13 that is measured in a cold season is as is displayed on the instrument panel 171, the capacity retention Q can change greatly at transitions of the seasons from a cold season, where the measurement of the capacity retention Q has a large error, to other season. As a result, the user checking the capacity retention Q may feel uncomfortable.

Thus, the present embodiment employs the following two processes to separate "estimating" and "display" of the capacity retention Q of the battery 13. First, a fitted curve (a capacity deterioration curve L) is used to estimate the capacity of the battery 13, and, the measurement value of the capacity retention Q is, rather than being displayed as is on the instrument panel 171, used to update the capacity deterioration curve L. This process is also referred to as a capacity deterioration curve "update process." Second, a value different from the measurement value of the capacity retention Q is permitted to be displayed on the instrument panel 171. This process is also referred to as a capacity retention "display process." In the following, these two processes are described in detail.

<Separation of Estimation and Display>

FIG. 6 is a diagram for illustrating the capacity deterioration curve L update process and the capacity retention Q display process, according to the present embodiment. Referring to FIG. 6, the use of results of measurement of the capacity retention Q of the battery 13 will be given, with reference to a time instance at which 33 months has elapsed since the time of manufacturing of the battery 13. The measurement values of the capacity retention Q of the battery 13 are indicated by the solid triangles. One can see that the measurement value at the present time is low from the decreasing capacity retention Q trend in the past (temporal transition). If this measurement value is displayed on the instrument panel 171, the user may feel uncomfortable, thinking that the capacity retention Q of the battery 13 has sharply decreased. Alternatively, the user may think that the battery 13 be deteriorated worse than it actually is, and underestimate the performance of the battery 13.

In contrast, in the present embodiment, the capacity deterioration curve L is used to estimate the capacity retention Q of the battery 13. By way of example, the capacity deterioration curve L can be represented by a polynomial curve indicated by Equation (1):

$$L:Q=1-(at^a+bt^2+ct+d) \quad (1)$$

where t is a time elapsed since the time of manufacturing of the battery 13.

The degree of the capacity deterioration curve L is predetermined by experiment. In Equation (1), the degree of the capacity deterioration curve L is 3. However, this is merely one example. The degree may be set to 2 or set to 4 or greater. The same degree may not be applied to all the time domains (the entire range of the horizontal axis). For example, the degree applied to one time domain and the degree applied to the remaining time domains may be different. Two or more capacity deterioration curves that are determined for each time domain may be connected together at the border between time domains (a spline curve).

Use of curve fitting (the regression analysis) approach allows calculation of a capacity deterioration curve L best fitting the measurement value of the capacity retention Q of the battery 13. More specifically, initial values are assigned to four coefficients a, b, c, and d, which are fitting parameters. For example, using non-linear least squares, the values of the four coefficients are adjusted until a predetermined convergence condition is met. This can optimize the four coefficients and determine the capacity deterioration curve L.

In the update process, the measurement value of a new capacity retention Q is used to update the capacity deterioration curve L. In this example, before the capacity deterioration curve L is measured in the 33rd month, the capacity deterioration curve L is calculated based on the measurement values of the capacity retention Q in a time period from the third month to the 30th month. Once a new measurement value is obtained in the 33rd month, curve fitting is performed, taking into an account this measurement value (i.e., based on the measurement values obtained in the period from the third month to the 33rd month), to re-calculate the capacity deterioration curve L.

In the display process, the capacity retention Q of the 33rd month is calculated, in accordance with the updated capacity deterioration curve L obtained by the update process. Specifically, the capacity retention Q of the 33rd month can be calculated by assigning (a time value corresponding to) 33 months to an elapsed time t in Equation (1) after the update. Then, the capacity retention Q calculated in accordance with the capacity deterioration curve L is displayed on the instrument panel 171. In FIG. 6, a display value of the capacity retention Q, which is displayed on the instrument panel 171, is indicated by a white triangle.

In this way, in the present embodiment, a new measurement value of the capacity retention Q is, rather than being displayed as is on the instrument panel 171, used to update the capacity deterioration curve L. Then, the capacity retention Q that is calculated in accordance with the updated capacity deterioration curve L is displayed on the instrument panel 171. The capacity deterioration curve L is calculated based on a large number of measurement values in the past (ten measurement values in the example of FIG. 6). Therefore, even if a new measurement value deviates from the decreasing capacity retention Q trend, its effect (changes in capacity deterioration curve L caused by a new measurement value) is relatively limited. Accordingly, the display value of the capacity retention Q is inhibited from resulting in excessively low. This can reduce chances that make the user feel uncomfortable, thinking that the capacity retention Q of the battery 13 has sharply decreased, and also prevent the user from misunderstanding that the battery 13 is deteriorated worse than it actually is.

<Process Flow>

FIG. 7 is a flowchart illustrating the capacity deterioration curve update process. The processes illustrated in the flowcharts of FIG. 7 and FIG. 8 described below are repeated for every predetermined computation period, for example. Each process step is implemented by software processing by the ECU 10. However, each process step may be implemented by hardware (an electric circuit) created within the ECU 10. Hereinafter, each step is abbreviated as S.

Referring to FIG. 7, in S11, the ECU 10 determines whether a predetermined condition that can ensure a large ΔSOC is met if external charging of the vehicle 1 is performed. For example, the ECU 10 can determine that the above condition is met if a difference between the current SOC of the battery 13 and a target SOC (an SOC difference before and after the external charging) is greater than or equal to a predetermined value (e.g., 55%).

In S12, the ECU 10 determines whether the external charging of the vehicle 1 is to be initiated. If the condition that can ensure a large ΔSOC is not met (NO in S11) or if it is not the time to initiate external charging (NO in S12), the ECU 10 returns the process to the main routine, without performing the subsequent processes.

As the external charging on the vehicle 1 initiates (YES in: S12), the ECU 10 obtains from the monitoring unit 131 the voltage VB and the current IB during the external charging (S13). Then, as the external charging of the vehicle 1 ends (YES in S14), the ECU 10 passes the process to S15, and calculates the capacity retention Q of the battery 13 based on the voltage VB and the current IB obtained during the external charging. For example, the capacity retention Q can be calculated as follows.

The ECU 10 obtains an open circuit voltage (OCV) of the battery 13 at the initiation of the external charging, an OCV of the battery 13 at the end of the external charging (considering the effects of polarization, preferably, OCV is one at a moment 30 minutes is elapsed since the external charging has actually ended), and an amount of charging current ΔAh of the battery 13 between the initiation and the end of the external charging. The ECU 10 further refers to a SOC-OCV curve pre-stored in the memory 102 to convert the difference between the OCV at the initiation of the external charging and the OCV at the end of the external charging into an SOC difference ΔSOC. The ECU 10 then calculates the full charge capacity C of the battery 13, in accordance with Equation (2) below. Equation (2) indicates that the percentage of the amount of charging current ΔAh to the SOC difference ΔSOC and the percentage of the full charge capacity C to SOC difference=100% are equal. Since the full charge capacity C0 at the initial state is known from the specifications of the battery 13, the capacity retention Q can be calculated from the full charge capacity C (Q=C/C0).

$$C=\Delta Ah/\Delta SOC \times 100 \qquad (2)$$

In S16, the ECU 10 obtains the time at which the external charging ended to calculate an elapsed time from the time of manufacturing of the battery 13 until the external charging of the battery 13 ends (a time period corresponding to the capacity retention Q calculated in S14).

In S17, the ECU 10 stores the present capacity retention Q calculated in S15 and the present elapsed time calculated in S16 into the memory 102 in a non-volatile manner. The memory 102 also stores the capacity retentions Q and elapsed times calculated several times in the past.

In S18, the ECU 10 reads the present data (the capacity retention Q, elapsed time) and data in the past (the capacity retention Q, elapsed time) from the memory 102, performs curve fitting to update the capacity deterioration curve L. Details of this computation has been described with respect to FIG. 6, and thus the description will not be repeated now.

FIG. 8 is a flowchart illustrating the capacity retention display process. The process steps illustrated in the flowchart are executable independently of the process steps illustrated in the flowchart for the capacity deterioration curve update process (see FIG. 7).

Referring to FIG. 8, in S21, the ECU 10 determines whether a request to display the capacity retention Q of the battery 13 on the instrument panel 171 (a display request) is generated. For example, the ECU 10 can determine that a display request is generated if the user interface 17 receives an operation for allowing the user to check the capacity retention Q. Where the capacity retention Q is displayed on the instrument panel 171 at all times, a display request may be generated periodically. If no display request is generated (NO in S21), the ECU 10 returns the process to the main routine, without performing the subsequent processes.

If a display request is generated (YES in S21), the ECU 10 obtains the time at which the display request is generated (the current time) and calculates an elapsed time since the time of manufacturing of the battery 13 until the display request is generated (S22).

In S23, the ECU 10 refers to the capacity deterioration curve L, which is up-to-date by the update process, thereby calculating the capacity retention Q in accordance with the elapsed time calculated in S22. The ECU 10 then displays the calculated capacity retention Q on the instrument panel 171 (S24). The ECU 10 may display the capacity deterioration curve L on the instrument panel 171. The user can intuitively grasp the transition of the capacity retention Q by checking the capacity deterioration curve L on the instrument panel 171.

As described above, in the present embodiment, if a capacity retention Q display request is generated, the indicator of deterioration calculated using the capacity deterioration curve L is displayed. By appropriately updating the capacity deterioration curve L by the update process, the capacity retention Q at the time of generation of a capacity retention Q display request can be estimated based on several measurement values in the past (which may include the latest measurement value if a display request is generated, accompanying the external charging). The use of the capacity deterioration curve L reflecting the transition of the capacity retention Q in the past allows the capacity retention Q to change smoothly, preventing sudden change in the capacity retention Q. Thus, according to the present embodiment, the user can be made less uncomfortable when checking the capacity retention Q.

Note that FIGS. 7 and 8 have been described, with reference to the ECU 10 performing the update process and the display process, stated differently, a "vehicle diagnostic system" according to the present disclosure being complete with the vehicle 1. However, the update process and the display process may be performed by the server 2 (the application server 20). Alternatively, the update process and the display process may be performed by different components, one of them may be performed by the ECU 10 and the other of them may be performed by the application server 20.

Moreover, when to calculate the capacity retention Q of the battery 13 (the update process running condition) is not limited to the time of external charging of the vehicle 1. However, the greater the SOC varying amount ΔSOC is, the higher the accuracy of measurement of the capacity retention Q is, as described with respect to FIG. 4. Therefore, desirably, a vehicle that can perform external charging calculates the capacity retention Q at the time of external charging and update the capacity deterioration curve L. In contrast, for a vehicle that does not support external charging, such as a typical hybrid vehicle, the update process may be performed during normal running.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A vehicle diagnostic system that diagnoses a power storage device mounted on a vehicle, the vehicle diagnostic system comprising:

a display that shows an indicator of deterioration indicating a degree of reduction of a full charge capacity of the power storage device; and
a processor that calculates the indicator to be displayed on the display, wherein
the processor
measures the full charge capacity of the power storage device each time a predetermined condition is met,
updates a capacity deterioration curve indicative of changes in over time of the indicator, based on a result of measurement of the full charge capacity of the power storage device, and
when a display request for showing the indicator on the display is generated, calculates the indicator by at a time when the display request is generated, referring to the updated capacity deterioration curve, and selects the calculated indicator to be shown on the display when the calculated indicator is different from the result of measurement.

2. The vehicle diagnostic system according to claim 1, wherein
the capacity deterioration curve is indicated by a predetermined relation, the relation includes the indicator and an elapsed time since a reference time as variables, and includes a plurality of coefficients defining a relationship between the indicator and the elapsed time, and the processor determines the plurality of coefficients by a regression analysis of the indicator and the elapsed time, the indicator being determined from the result of measurement of the full charge capacity of the power storage device at a time when the predetermined condition is met, and updates the capacity deterioration curve using the relation that includes the determined plurality of coefficients.

3. The vehicle diagnostic system according to claim 1, wherein
the vehicle is capable of performing external charging in which an electric power supplied external to the vehicle is charged to the power storage device, and the time when the predetermined condition is met includes after completion of the external charging.

4. The vehicle diagnostic system according to claim 1, wherein
the indicator includes a capacity retention of the power storage device.

5. The vehicle diagnostic system according to claim 1, wherein
the indicator includes the full charge capacity of the power storage device.

6. The vehicle diagnostic system according to claim 1, wherein
the indicator includes a distance that the vehicle can travel with an electric power stored in the power storage device.

7. The vehicle diagnostic system according to claim 1, wherein
the display shows the capacity deterioration curve, in addition to the indicator.

8. A vehicle, comprising:
the vehicle diagnostic system according to claim 1; and
the power storage device.

9. A method of display of a vehicle diagnostic result, for displaying a result of diagnosis of a vehicle on which a power storage device is mounted, the method including:
measuring a full charge capacity of the power storage device each time a predetermined condition is met, and, based on a result of measuring of the full charge capacity, updating a capacity deterioration curve indicative of changes in over time of an indicator of deterioration of the power storage device;
when a display request for showing the indicator on the display is generated, calculating the indicator by referring to the updated capacity deterioration curve; and selecting the calculated indicator to be displayed on the display when the calculated indicator is different from the result of the measuring of the full charge capacity.

* * * * *